United States Patent
Kao et al.

(10) Patent No.: US 10,109,519 B2
(45) Date of Patent: Oct. 23, 2018

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Hsiang-Lun Kao, Taoyuan County (TW); Tien-Lu Lin, Hsinchu (TW); Yung-Chih Wang, Taoyuan (TW); Cheng-Chi Chuang, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/277,100

(22) Filed: Sep. 27, 2016

(65) Prior Publication Data

US 2017/0018498 A1     Jan. 19, 2017

Related U.S. Application Data

(62) Division of application No. 14/212,872, filed on Mar. 14, 2014, now Pat. No. 9,455,178.

(51) Int. Cl.
*H01L 21/768* (2006.01)
*H01L 23/522* (2006.01)
(Continued)

(52) U.S. Cl.
CPC ........ *H01L 21/7682* (2013.01); *H01L 21/764* (2013.01); *H01L 21/76802* (2013.01);
(Continued)

(58) Field of Classification Search
CPC ............. H01L 23/4821; H01L 21/7682; H01L 23/5222; H01L 21/76831; H01L 21/76802; H01L 21/76807; H01L 21/76808; H01L 2221/1063; H01L 23/5226; H01L 21/764; H01L 21/76843; H01L 23/528
See application file for complete search history.

(56) References Cited

U.S. PATENT DOCUMENTS 6,177,329 B1 *  1/2001  Pang ..................... H01L 21/764
                                                             257/E21.573
6,577,011 B1 *  6/2003  Buchwalter ......... H01L 21/7682
                                                             257/751

(Continued)

FOREIGN PATENT DOCUMENTS

TW          200529363 A          9/2005

OTHER PUBLICATIONS

Chinese Office Action dated Apr. 21, 2016 issued in Application No. 103146498, 4 pages.

*Primary Examiner* — Bac Au
(74) *Attorney, Agent, or Firm* — Haynes and Boone, LLP

(57) ABSTRACT

A method of fabricating a semiconductor integrated circuit (IC) is disclosed. A conductive feature over a substrate is provided. A first dielectric layer is deposited over the conductive feature and the substrate. A via-forming-trench (VFT) is formed in the first dielectric layer to expose the conductive feature and the substrate around the conductive feature. The VFT is filled in by a sacrificial layer. A via-opening is formed in the sacrificial layer to expose the conductive feature. A metal plug is formed in the via-opening to connect to the conductive feature. The sacrificial layer is removed to form a surrounding-vacancy around metal plug and the conductive feature. A second dielectric layer is deposited over the substrate to seal a portion of the surrounding-vacancy to form an enclosure-air-gap all around the metal plug and the conductive feature.

20 Claims, 11 Drawing Sheets

(51) Int. Cl.
    *H01L 21/764*       (2006.01)
    *H01L 23/532*       (2006.01)
(52) U.S. Cl.
    CPC .. *H01L 21/76804* (2013.01); *H01L 21/76831* (2013.01); *H01L 21/76837* (2013.01); *H01L 21/76843* (2013.01); *H01L 21/76877* (2013.01); *H01L 21/76879* (2013.01); *H01L 23/5222* (2013.01); *H01L 23/5226* (2013.01); *H01L 23/53295* (2013.01); *H01L 21/76885* (2013.01); *H01L 23/53223* (2013.01); *H01L 23/53238* (2013.01); *H01L 23/53266* (2013.01); *H01L 2924/0002* (2013.01)

(56)            References Cited

U.S. PATENT DOCUMENTS

| 6,633,074 | B2 * | 10/2003 | Ahn .................. H01L 21/7682 257/522 |
| 6,737,725 | B2 | 5/2004 | Grill et al. |
| 6,917,109 | B2 * | 7/2005 | Lur .................... H01L 21/7682 257/522 |
| 7,671,442 | B2 * | 3/2010 | Anderson ......... H01L 21/76802 257/276 |
| 7,868,455 | B2 * | 1/2011 | Chen ................ H01L 21/76807 257/750 |
| 7,871,923 | B2 * | 1/2011 | Liu .................. H01L 21/76807 438/622 |
| 8,264,060 | B2 * | 9/2012 | Braeckelmann .... H01L 21/7682 257/522 |
| 8,470,685 | B2 | 6/2013 | Torres et al. |
| 2009/0081862 | A1 | 3/2009 | Chen et al. |
| 2009/0140428 | A1 | 6/2009 | Bonilla et al. |
| 2009/0294898 | A1 | 12/2009 | Feustel et al. |
| 2010/0133648 | A1 | 6/2010 | Seidel et al. |
| 2014/0264479 | A1 * | 9/2014 | Cai ...................... H01L 29/401 257/288 |
| 2014/0308794 | A1 * | 10/2014 | Lee .................. H01L 21/76855 438/381 |
| 2015/0262860 | A1 | 9/2015 | Kao et al. |

* cited by examiner

METHOD OF SEMICONDUCTOR INTEGRATED CIRCUIT FABRICATION

PRIORITY DATA

The present application is a divisional application of U.S. application Ser. No. 14/212,872, filed Mar. 14, 2014, which is hereby incorporated by reference in its entirety.

BACKGROUND

The semiconductor integrated circuit (IC) industry has experienced rapid growth. Technological advances in IC design and materials have produced generations of ICs where each generation has smaller and more complex circuits than previous generations. In the course of IC evolution, functional density (i. e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop improved dielectric and metal interconnection processes and structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
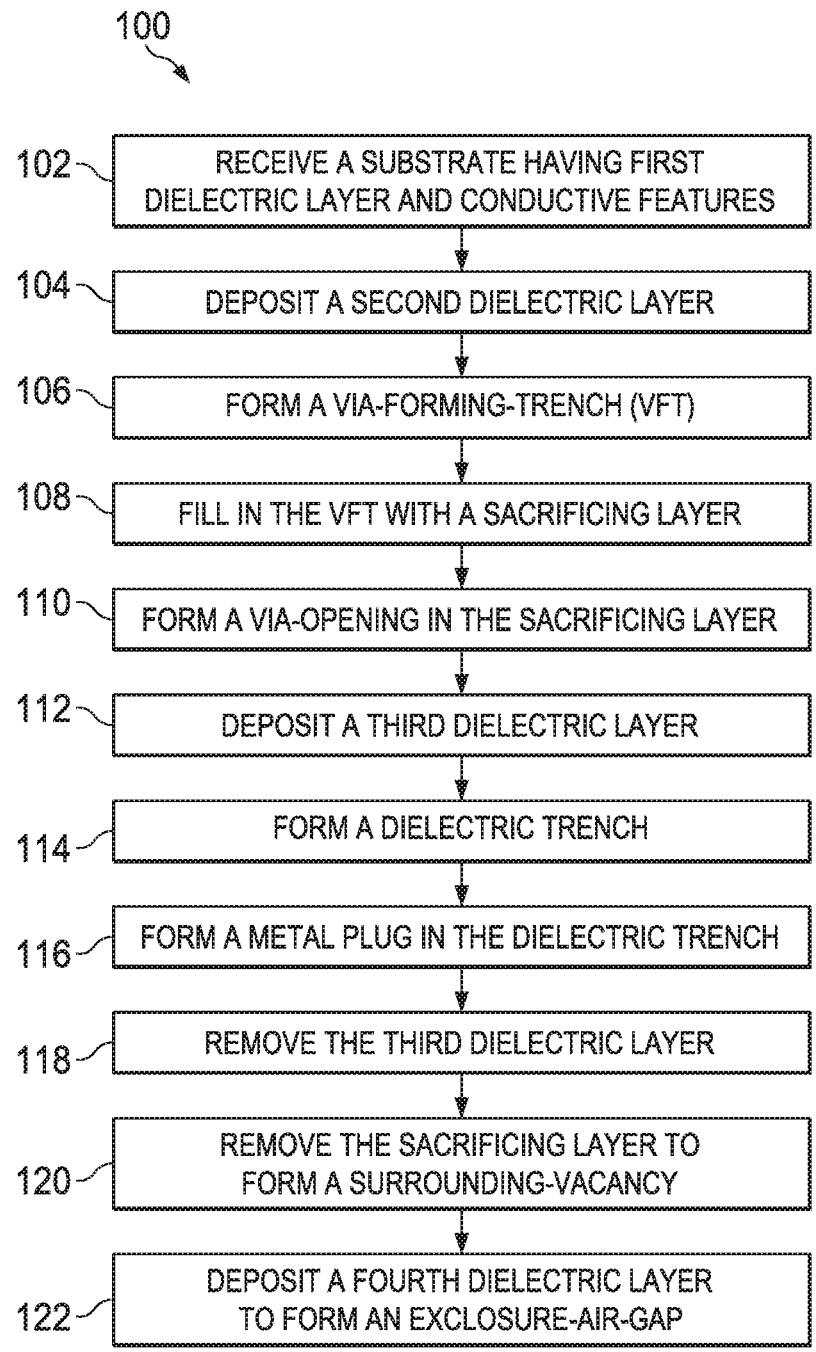
FIG. 1 is a flowchart of an example method for fabricating a semiconductor integrated circuit (IC) constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of one embodiment of a method 100 of fabricating one or more semiconductor devices according to aspects of the present disclosure. The method 100 is discussed in detail below, with reference to an IC device 200 shown in FIGS. 2 to 12 for the sake of example. It is understood that additional steps can be provided before, during, and after the method, and some of the steps described can be replaced or eliminated for other embodiments of the method.

Figure 2:
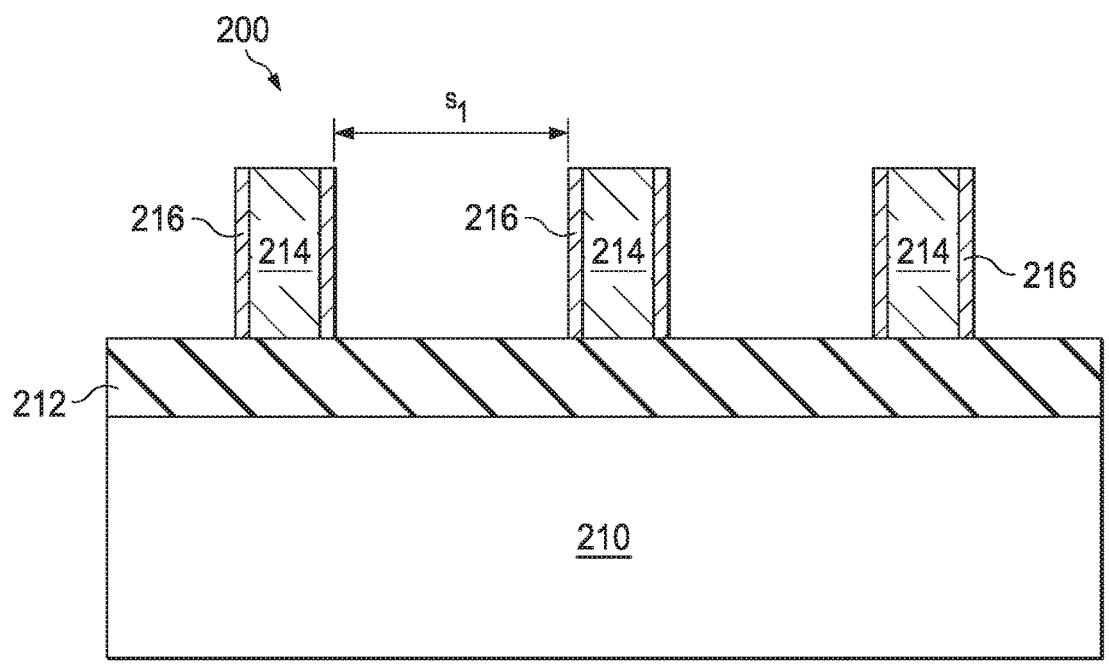
FIGS. 2 to 12 are cross-sectional views of an example semiconductor integrated circuit (IC) at fabrication stages constructed according to the method of FIG. 1.

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 also includes a first dielectric layer 212. The first dielectric layer 212 includes a dielectric material such as silicon oxide or silicon nitride The first dielectric layer 212 may have a dielectric constant (k) lower than thermal silicon oxide (therefore referred to as low-k dielectric material layer), and/or other suitable dielectric properties. A process of forming the first dielectric layer 212 may utilize chemical vapor deposition (CVD), or other suitable techniques.

The substrate 210 also includes a plurality of conductive features 214. The conductive features 214 may include a doped region such as source and drain (S/D), a gate electrode, and/or a portion of the interconnect structure, such as a contact, metal via, or metal line. In one embodiment, the conductive features 214 include electrodes, capacitors, resistors or a portion of a resistor. The conductive features 214 may be formed by one or more procedures such as lithography, etching and deposition. A space between two adjacent conductive features 214 is a first spacing $s_1$.

In one embodiment, a barrier 216 is formed along sidewalls of the conductive features 214. The barrier 216 may include titanium nitride (TiN), tantalum nitride (TaN), tungsten nitride (WN), titanium silicon nitride (TiSiN), tantalum silicon nitride (TaSiN), or other suitable materials.

Figure 3:
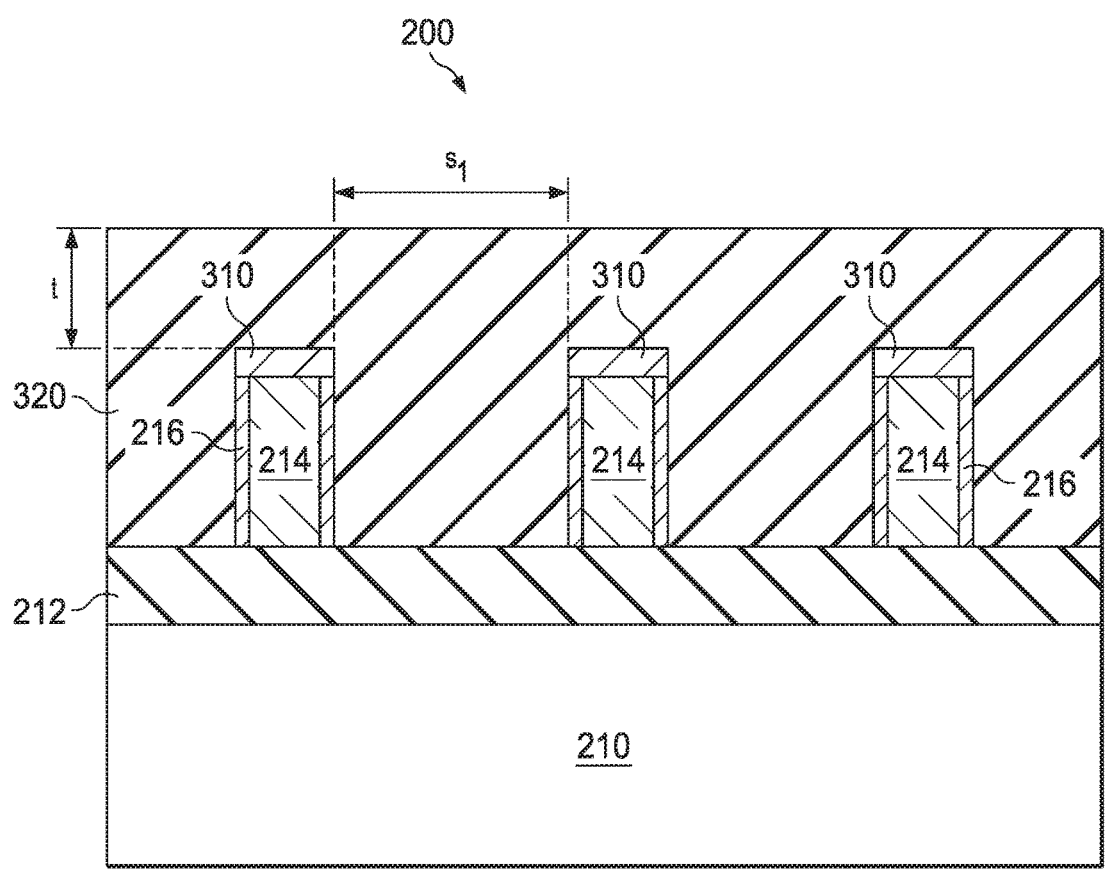

Referring to FIGS. 1 and 3, the method 100 proceeds to step 104 by depositing a second dielectric layer 320 over the substrate, including over the conductive features 214. In one embodiment, prior to depositing the second dielectric layer 320, a cap 310 is formed to cover a top surface of the conductive features 214. The cap 310 may include tantalum (Ta), titanium (Ti), manganese (Mn), cobalt (Co), ruthenium (ru), TiN, TaN, WN, TiSiN, TaSiN, manganese oxide (MnO), aluminium nitride, aluminum oxide, or other suitable materials. The cap 310 may be formed by processes such as deposition, photolithography and etch.

The second dielectric layer 320 then fully fills in spaces between conductive features 214 and extends to above a top surface of the conductive feature 214 with a predetermined thickness t. The predetermined thickness is designed to define a height of a via-opening, to be formed in a subsequent step, which will be described in the following description. The second dielectric layer 320 may include a dielectric material layer, such as silicon oxide, silicon nitride, a dielectric material layer having a dielectric constant (k) lower than thermal silicon oxide (therefore referred to as low-k dielectric material layer), or other suitable dielectric material layer. A process of forming the second dielectric layer 320 may include CVD, spin-on coating or other suitable techniques. The second dielectric 320 may be conformal or planar, using techniques known in the art. In the present example, the second dielectric 320 is made planar by chemical mechanical polishing.

Figure 4:
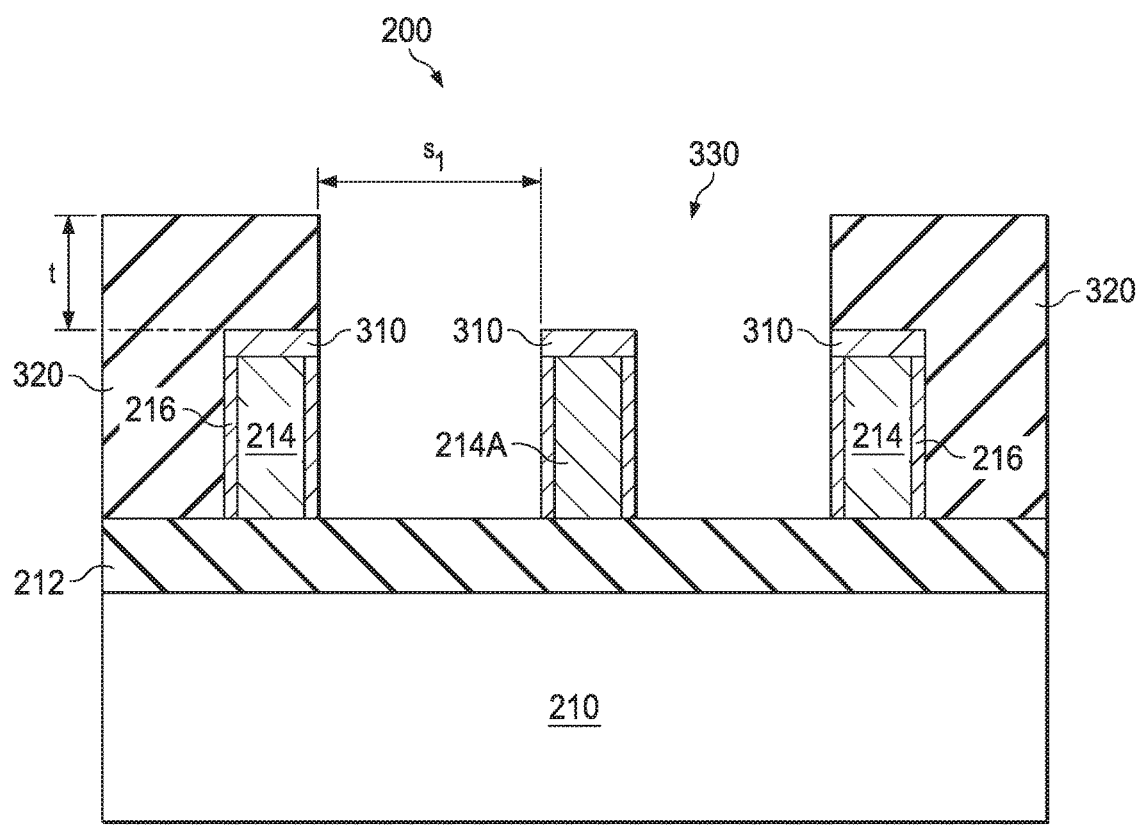

Referring to FIGS. 1 and 4, the method 100 proceeds to step 106 by removing a portion of the second dielectric layer 320 to form a via-forming trench (VFT) 330. In the VFT 330, a subset of the conductive features 214, now labeled with the reference number 214A, are exposed, as well as a portion of the first dielectric layer 212, which is around the conductive features 214A. In some embodiments, some or all of the sidewalls of the conductive features 214/214A may also be exposed. The VFT 330 may be formed by etching the second dielectric layer 320 through a patterned photoresist layer. Generally, a patterning process may include photoresist coating (e. g., spin-on coating), exposing, developing the photoresist, other suitable processes, or combinations thereof. The second dielectric layer 320 is then etched through the pattern photoresist layer to form the VFT 330. The second dielectric layer 320 may be etched by various methods, including a dry etch, a wet etch, or a combination of thereof.

Figure 5:
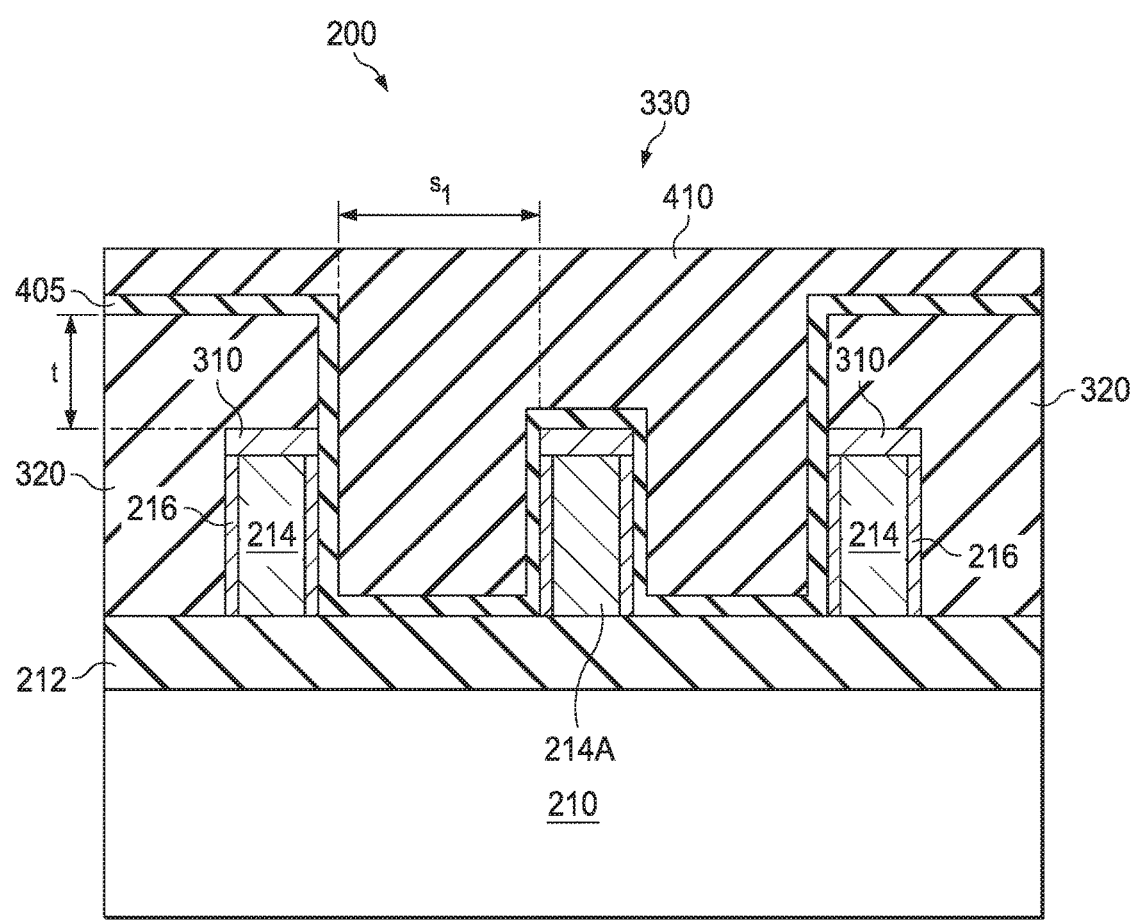

Referring to FIGS. 1 and 5, the method 100 proceeds to step 108 by filling in the VFT 330 with a sacrificial layer (SL) 410. The SL 410 may include titanium oxide TiO deposited by ALD, or CVD. Alternatively, the SL 410 may include spin-on glass (SOG), silicon oxide, or other dielectric materials deposited by any suitable method, such as spin-on coating, ALD, CVD, and ozone oxidation. In one embodiment, prior to depositing the SL 410, an etch-stop-layer (ESL) 405 is deposited over the VFT 330, including wrapping the conductive features 214A. The ESL 405 may include silicon nitride, silicon oxide, silicon carbide, silicon carbide nitride, or other suitable material. The ESL 405 is chosen to be different from the SL 410 to achieve etching selectivity during a subsequent etch, which will be described in the following description. The ESL 405 may be deposited by any suitable techniques, such as CVD, PVD and ALD. In one embodiment, a recess process is applied to remove excessive SL 410.

Figure 6:
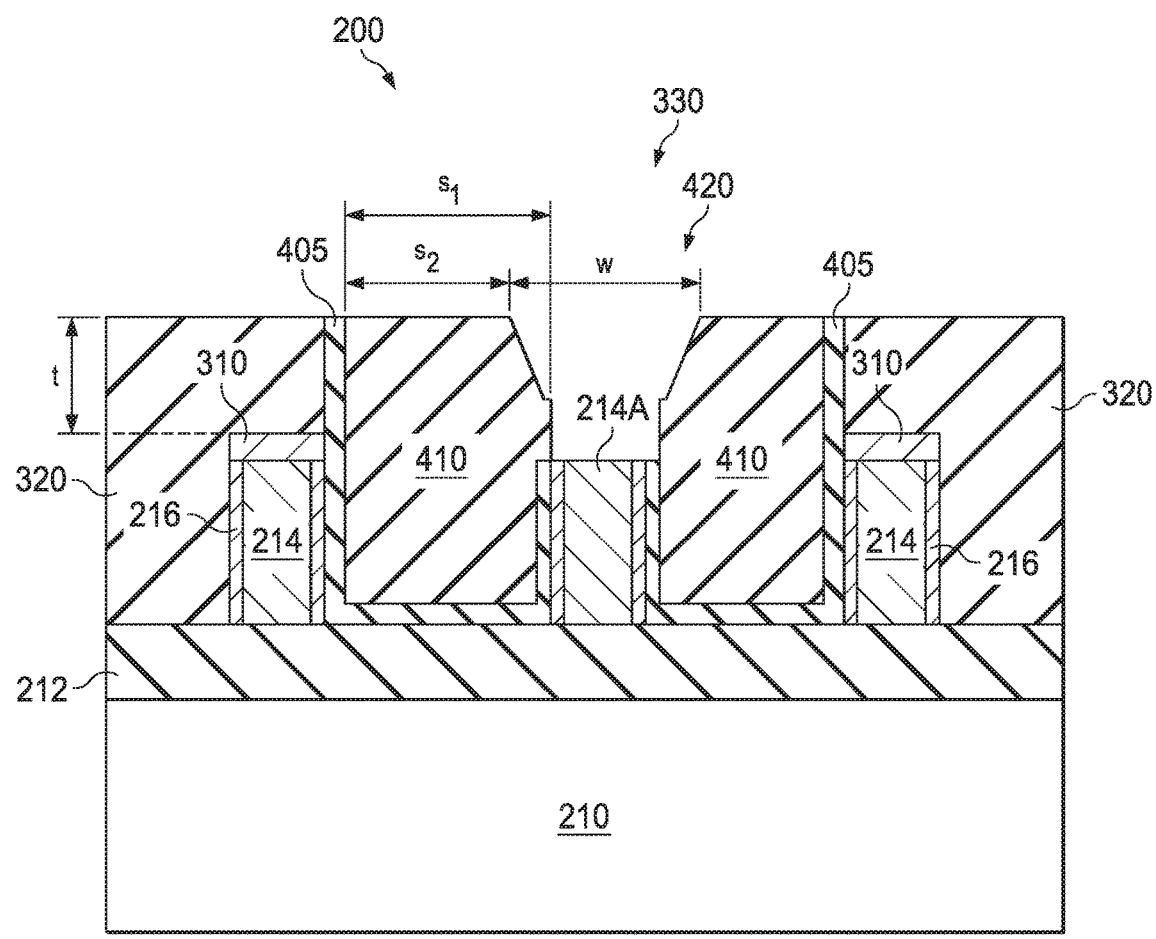

Referring to FIGS. 1 and 6, the method 100 proceeds to step 110 by forming a via-opening 420 in the VFT 330. The via-opening 420 aligns to the respective conductive feature 214A and a top surface of the conductive feature 214A is exposed in the via-opening 420. The via-opening 420 may be formed by etching the SL 410, as well as the ESL 405, through a patterned mask layer. Protected by the SL 410 and the ESL 405, the adjacent conductive feature 214 (locates next to the conductive feature 214A) may remain intact during forming the via-opening 420, which will reduce via-induced-metal-bridge (VIMB) issue.

As has been mentioned previously in step 104, the thickness t is chosen to define a height of the via-opening 420. In one embodiment, the via-opening 420 is formed to have a lower portion and an upper portion with different profiles. The lower portion has a vertical profile while the upper portion has a taper profile, which has a wider opening at its top. The two portions of the via-opening 420 may be formed by two etch steps with different etch conditions, such as gases, or chemicals. A width w of the wider opening of the via-opening 420 is controlled to achieve a second spacing $s_2$, a distance from a top edge of the via-opening 420 to an edge of the VFT 330. In one embodiment, the second spacing $s_2$ is designed to be substantial smaller than the first spacing $s_1$ to form a narrow-neck entry of a surrounding-vacancy in subsequence processes, which will be described in the following description. The SL 410, as well as the ESL 405, outside the VFT 330 is also removed during the via-opening etch, or by a separate etch process.

Figure 7:
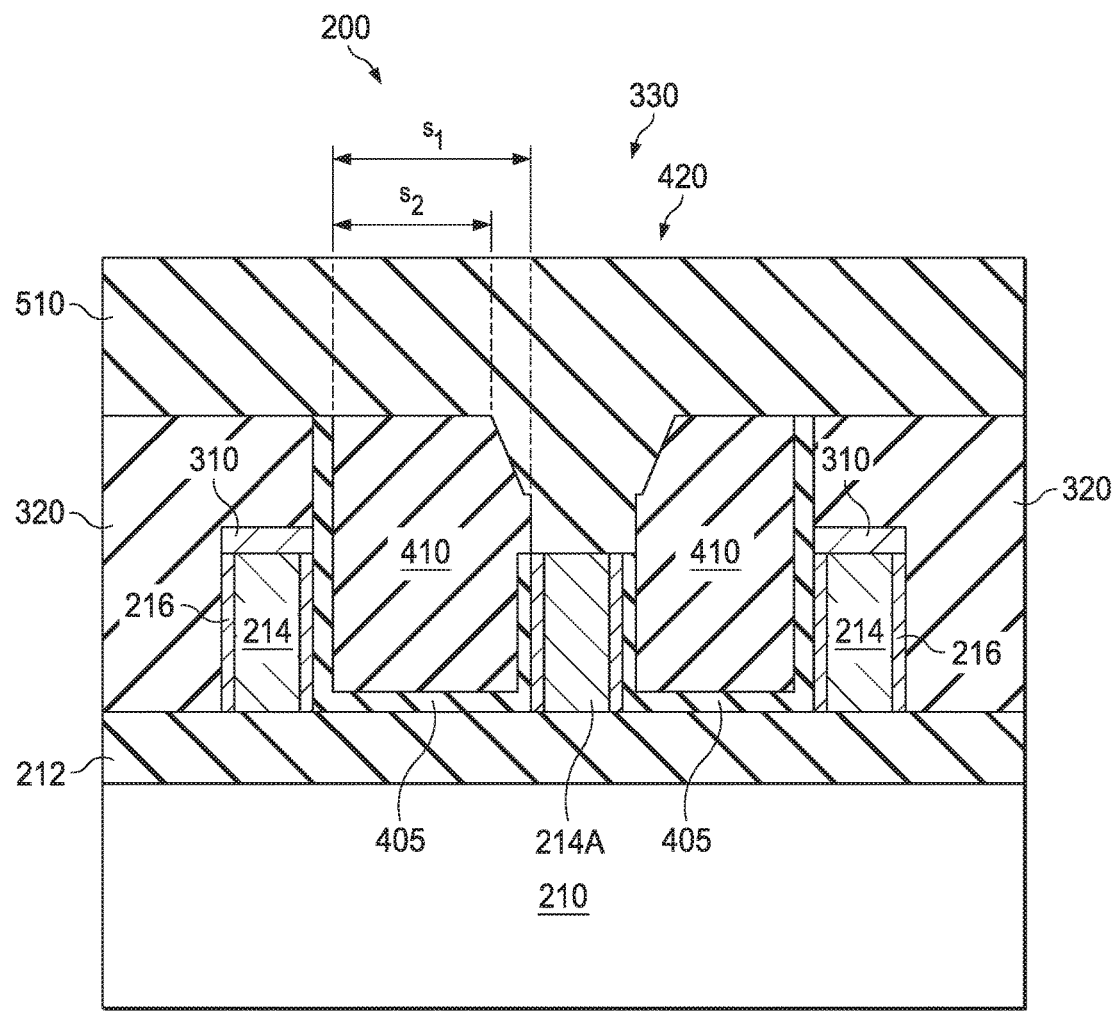

Referring to FIGS. 1 and 7, the method 100 proceeds to step 112 by depositing a third dielectric layer 510 over the second dielectric layer 320, including filling in the via-opening 420. The third dielectric layer 510 may be similar in many respects to the second dielectric layer 320 discussed above in association with FIG. 3. In one embodiment, the third dielectric layer 510 is different from the second dielectric layer 320 to achieve etching selectivity during a subsequent etch.

Figure 8:
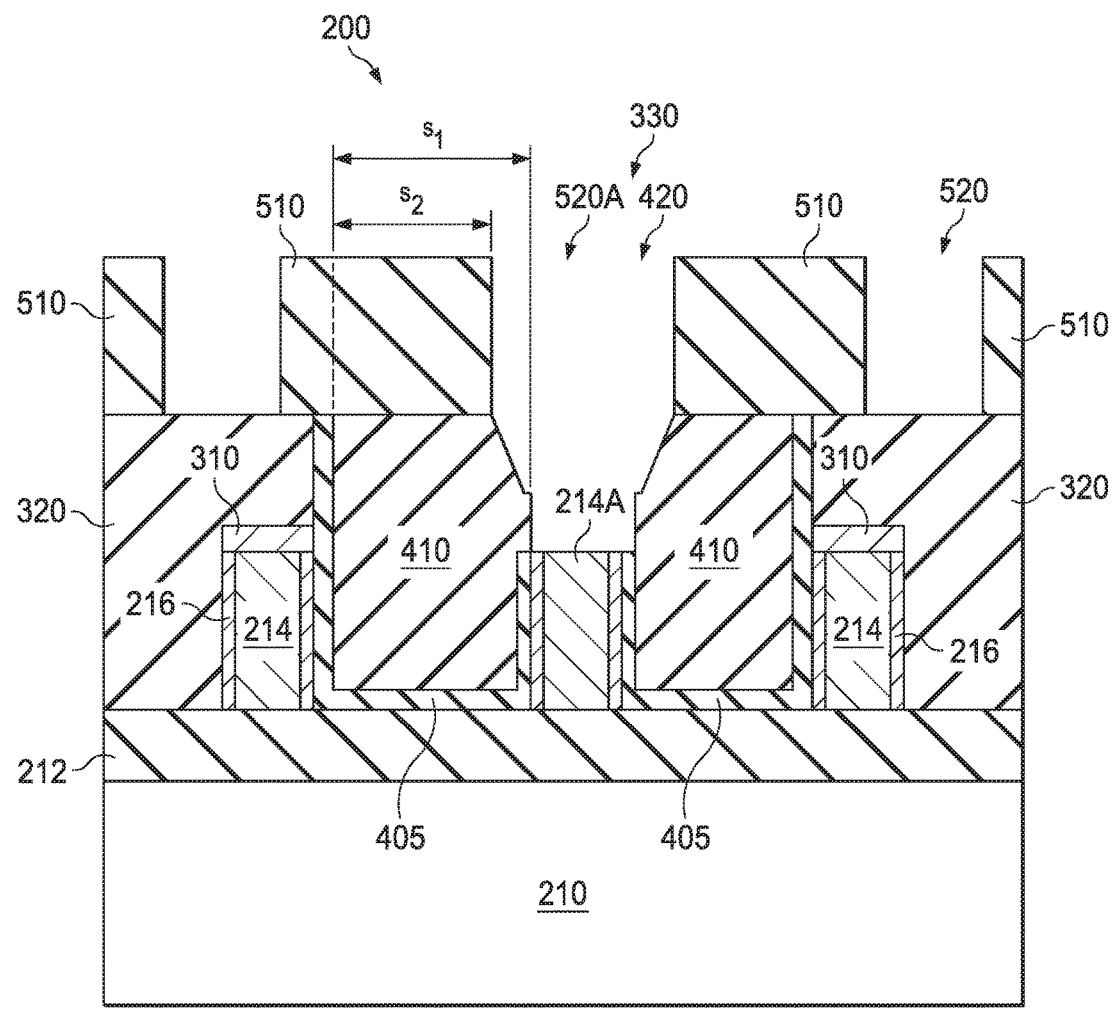

Referring to FIGS. 1 and 8, the method 100 proceeds to step 114 by forming dielectric trenches 520 in the third dielectric layer 510 and removing the third dielectric layer 510 from the via-opening 420. Some of the dielectric trenches 520 are formed to align to the respective via-opening 420, now labeled with the reference number 520A. The dielectric trenches 520 may be formed similarly in many respects to the VFT 420 discussed above in association with FIG. 4. The third dielectric layer 510 may be removed by a selective dry etch, a selective wet etch, or combination thereof. The etching selectively removes third dielectric layer 510 but does not substantially etch the second dielectric layer 320. In the dielectric trench 510A, the third dielectric layer 510 is removed down from the via-opening 420. Thus the dielectric trench 510A is connected to the via-opening 420. The ESL 410 in the dielectric trench 510 is removed as well in the etch process.

Figure 9:
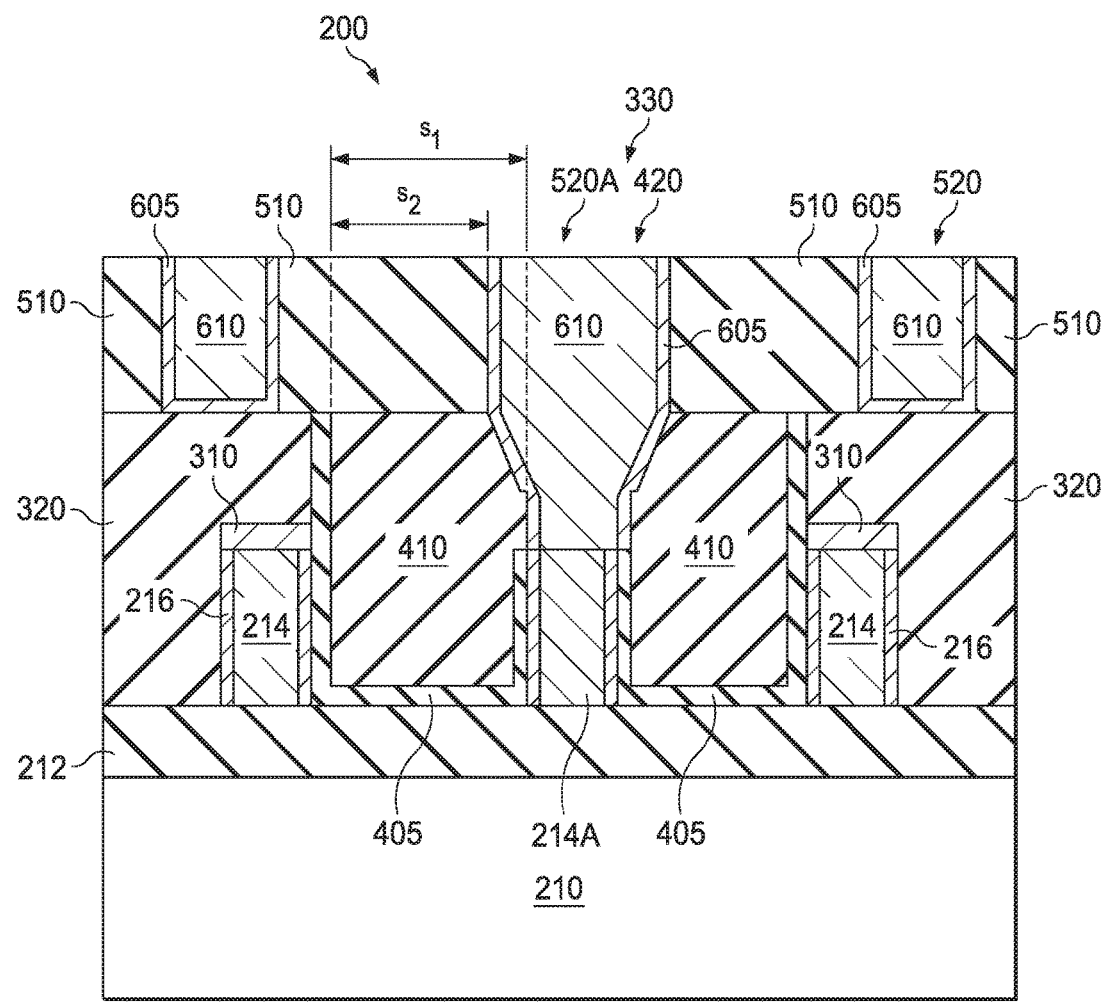

Referring to FIGS. 1 and 9, the method 100 proceeds to step 116 by forming a metal plug 610 in the dielectric trenches 520 and 520A, as well as the via-opening 420. The metal plug 610 formed in the dielectric trench 520A and the via-opening 420, forms a full contact extending down to the conductive feature 214A. For the sake of clarity for better descriptions, the metal plug 610 in the via-opening 420 is referred as to metal via 610A. The metal via 610A carries the taper profile of the via-opening 420, which has the second space $s_2$ be substantial smaller than the first space $s_1$.

In one embodiment, a barrier layer 605 is formed first in the dielectric trench 520, including the via-opening 420, by a proper deposition technique, such as PVD and CVD. The barrier layer 605 may include a metal and is electrically conductive but does not permit inter-diffusion and reactions between dielectric layers and a conductive material to be filled in the dielectric trench 520. The barrier layer 605 may include refractory metals and their nitrides. In various examples, the barrier layer includes TiN, TaN, Co, WN, TiSiN, TaSiN, or combinations thereof. The barrier layer may include multiple films.

A metal layer then fills in the dielectric trenches 520 and 520A, as well as the via-opening 420, over the barrier layer 605. The metal layer may include copper (Cu), aluminum (Al), tungsten (W), copper or copper alloy, such as copper magnesium (CuMn), copper aluminum (CuAl) or copper silicon (CuSi), or other suitable conductive material. The metal layer 610 may be deposited by PVD, CVD, metal-organic chemical vapor deposition (MOCVD), or plating. Additionally, a CMP is performed to etch back the excessive metal layer, as well as the excessive barrier layer 605, to form the metal plug 610 in the dielectric trench 520.

Figure 10:
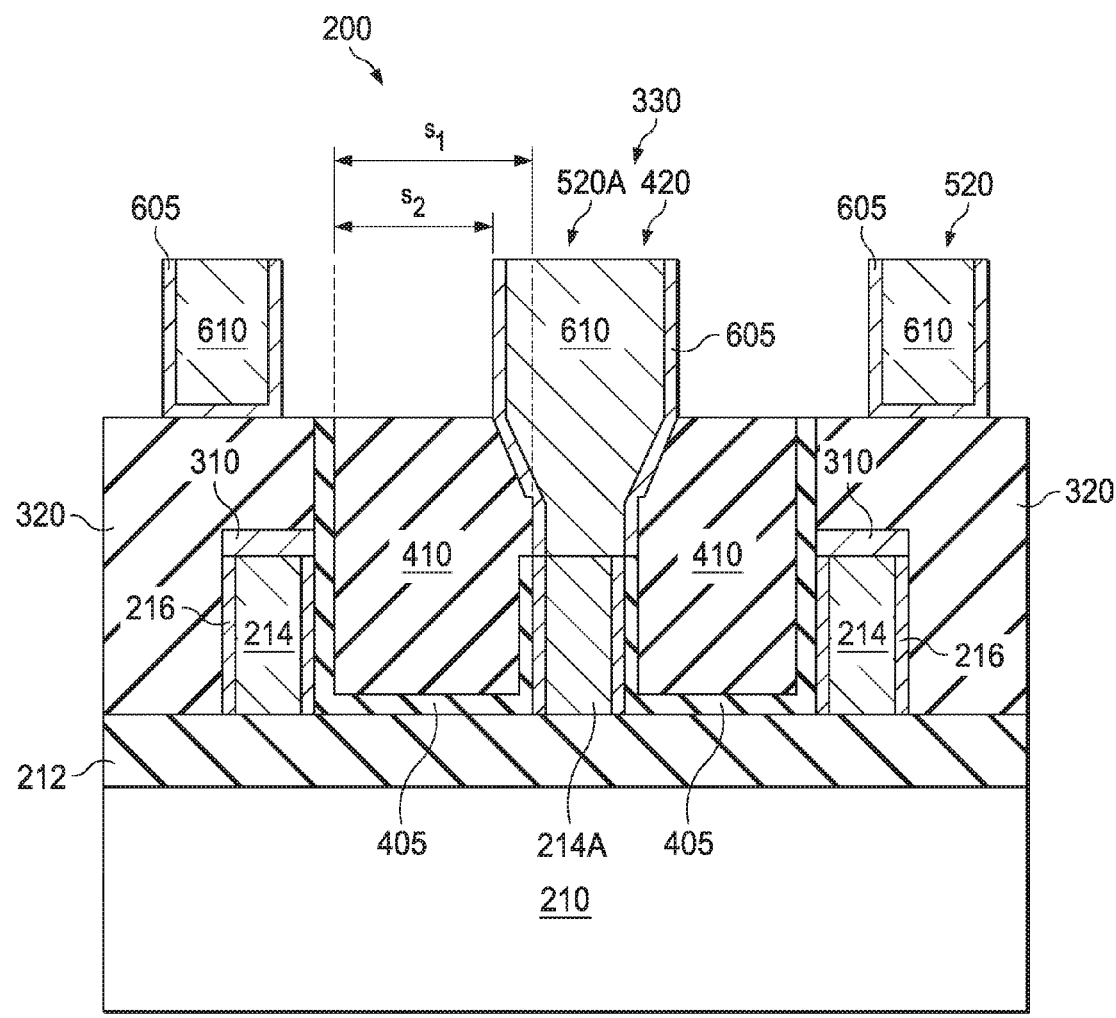

Referring to FIGS. 1 and 10, the method 100 proceeds to step 118 by removing the third dielectric layer 510. The third dielectric layer 510 may be selectively removed by a wet etch, a dry etch, or a combination thereof. The etching selectively removes the third dielectric layer 510 but substantially does not etch the second dielectric layer 320 and the SL 410.

Figure 11:
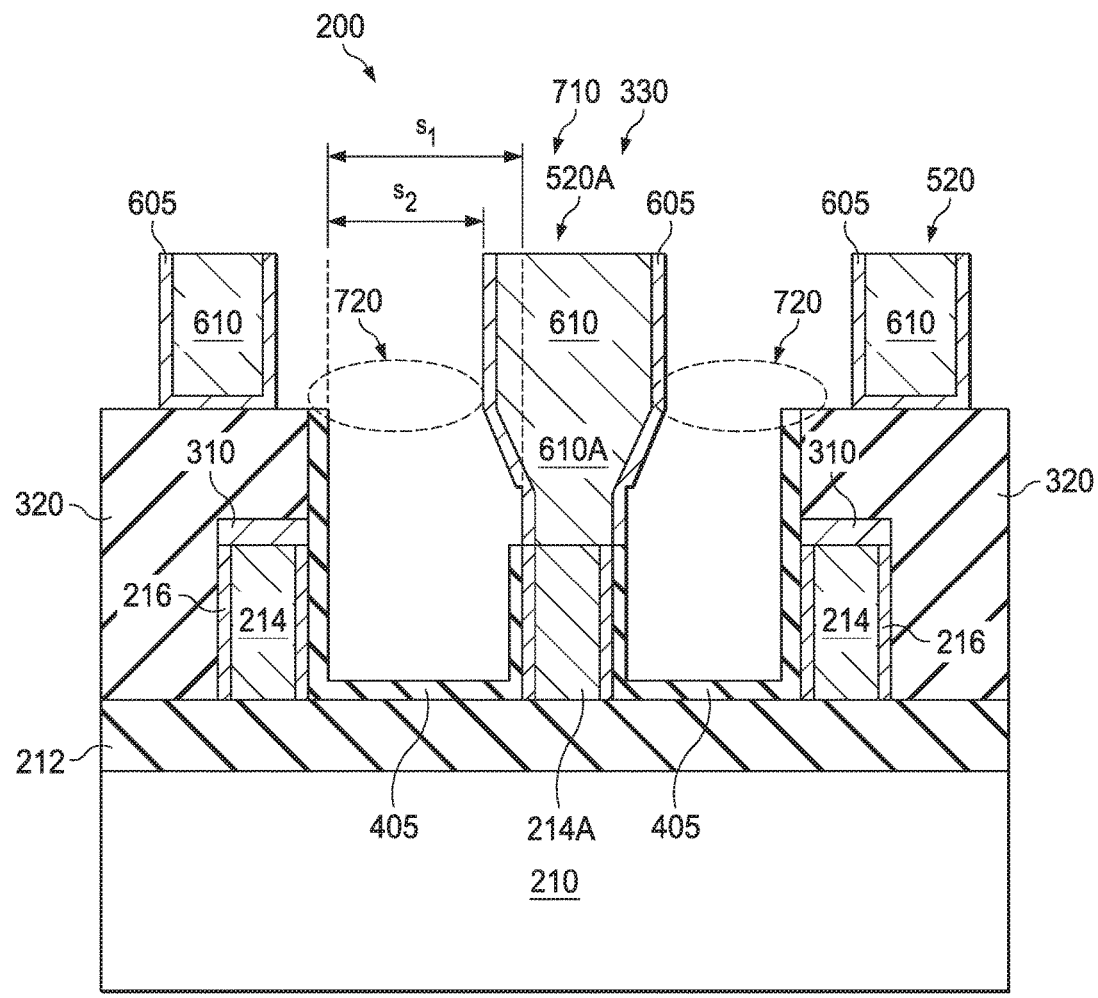

Referring to FIGS. 1 and 11, the method 100 proceeds to step 120 by removing the SL 410 to form a surrounding-vacancy 710 around the metal via 610A and the conductive feature 214A. The SL 410 may be selectively removed by a wet etch, a dry etch, or a combination thereof. With the ESL 405, etching process constrains are relaxed and process window is improved. As has been mentioned previously, in one embodiment, with the second spacing $s_2$ is substantial smaller than the first spacing $s_1$, the surrounding-vacancy 710 has a narrow-neck entry 720 locating between the top edge of metal via 610A and the edge of the VFT 330. By adjusting the second spacing 52, a width of the narrow-neck entry 720 is able to be adjusted.

Figure 12:
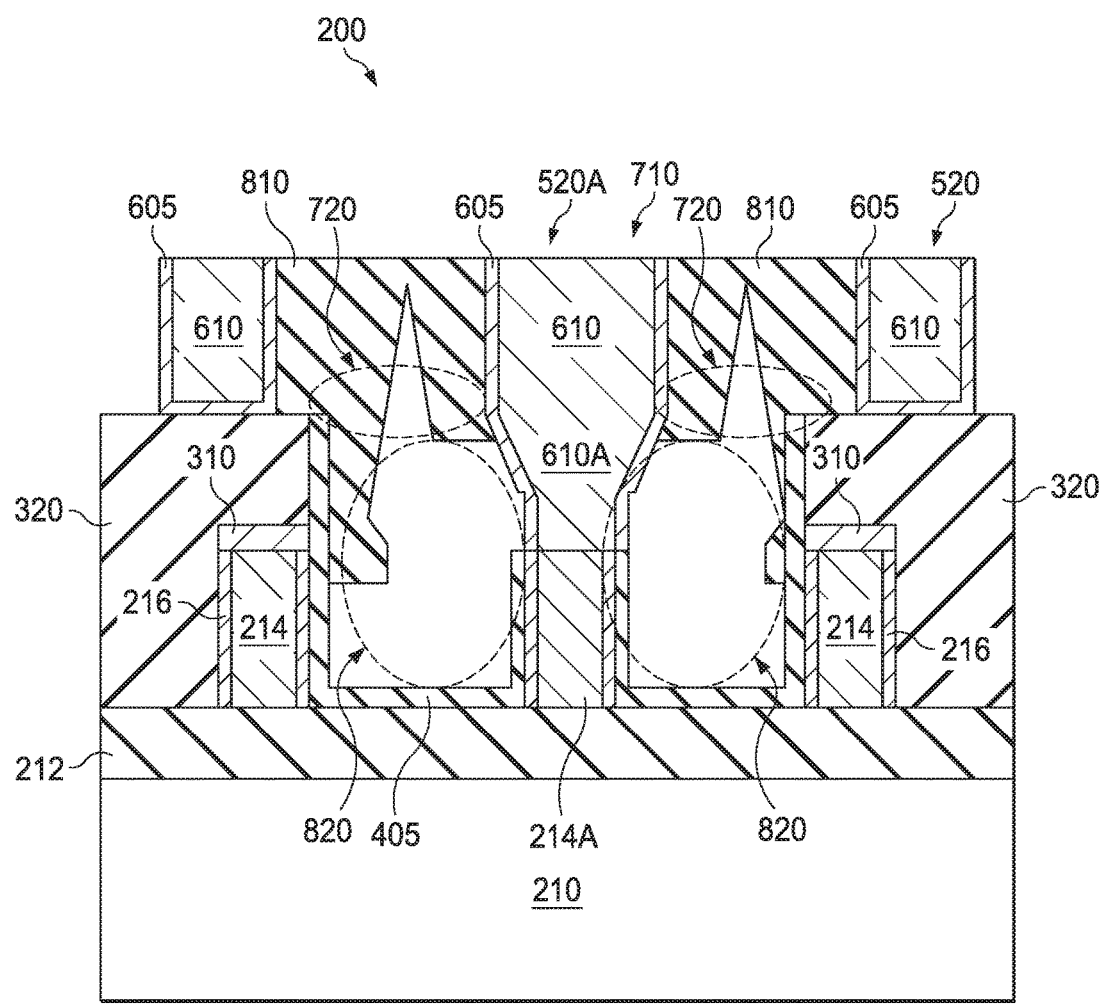

Referring to FIGS. 1 and 12, the method 100 proceeds to step 124 by depositing the fourth dielectric layer 810 to seal the surrounding-vacancy 710 and form an enclosure-air-gap 820 all around the metal via 610A and the conductive feature 214A. The fourth dielectric layer 810 may include silicon oxide, silicon nitride, a dielectric material layer having a dielectric constant (k) lower than thermal silicon oxide (therefore referred to as low-k dielectric material layer), or other suitable dielectric material layer. The fourth dielectric layer 810 may be deposited by CVD, spin-on coating, or other suitable techniques. By choosing a proper deposition process, instead of filling in the surrounding-vacancy 710, the fourth dielectric layer 810 seals the surrounding-vacancy 710 to form the enclosure-air-gap 820 all around the metal via 610A and the conductive feature 214A. In one embodiment, the fourth dielectric layer 810 is deposited by CVD and the CVD deposition rate is tuned to be high enough such that the fourth dielectric layer 810 closes up at an upper portion of the surrounding-vacancy 710 before completely filling in the surrounding-vacancy 710. In one embodiment, with the narrow-neck entry 720, the fourth dielectric layer 810 seals the surrounding-vacancy 710 at close to the narrow-neck entry 720 before completely filling in the surrounding-vacancy 710.

Additional steps can be provided before, during, and after the method 100, and some of the steps described can be replaced, eliminated, or moved around for additional embodiments of the method 100. The device 200 may undergo further CMOS or MOS technology processing to form various features and regions.

Based on the above, the present disclosure offers a method for fabricating a IC device. The method employs forming a surrounding-vacancy by removing a sacrificial layer adjacent to a metal via and forming an enclosure-air-gap by sealing an upper portion of the surrounding-vacancy by depositing a film over the surrounding-vacancy. The method provides an integration to form the enclosure-air-gap all around a conductive feature. The method demonstrates improvements for VIMB and time-dependent-dielectric-breakdown (TDDB) performance and reduction of capacitance of metal line.

The present disclosure provides many different embodiments of fabricating a semiconductor IC that provide one or more improvements over existing approaches. In one embodiment, a method for fabricating a semiconductor integrated circuit (IC) includes providing a conductive feature over a substrate, depositing a first dielectric layer over the conductive feature and the substrate, forming a via-forming-trench (VFT) in the first dielectric layer to expose the conductive feature and the substrate around the conductive feature. The method also includes filling in the VFT with a sacrificial layer, forming a via-opening in the sacrificial layer to expose the conductive feature, forming a metal plug in the via-opening to connect to the conductive feature, selectively removing the sacrificial layer to form a surrounding-vacancy around metal plug and the conductive feature and depositing a second dielectric layer over the substrate to seal a portion of the surrounding-vacancy to form an enclosure-air-gap all around the metal plug and the conductive feature.

In another embodiment, a method for fabricating a semiconductor IC includes providing a conductive feature over a substrate, depositing a first dielectric layer over the conductive feature and the substrate, forming a via-forming-trench (VFT) in the first dielectric layer to expose the conductive feature and the substrate around the conductive feature, filling in the VFT with a sacrificial layer, forming a via-opening in the sacrificial layer to expose the conductive feature, depositing a second dielectric layer over the sacrificial layer, removing a portion of the second dielectric layer to form a dielectric trench to connect down to the via-opening, forming a metal plug in the dielectric trench and the via-opening, removing the second dielectric layer, selectively removing the sacrificial layer to form a surrounding-vacancy around metal plug and the conductive feature and depositing a third dielectric layer over the substrate to seal a portion of the surrounding-vacancy to form an enclosure-air-gap all around the metal plug and the conductive feature.

In yet another embodiment, a semiconductor IC includes a substrate, a conductive feature over the substrate, a via metal on top of the conductive feature. The via metal has a tapper profile and a width of its top portion is wider than a width for its lower portion. The IC also includes a metal plug on top of the via metal, an enclosure-air-gap all around the conductive feature and the via metal. The IC also includes a dielectric layer over the enclosure-air-gap and separating the metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor integrated circuit (IC), the IC comprising:
    a substrate;
    a conductive feature disposed over the substrate;
    a via metal disposed on top of the conductive feature, where in the via metal has a tapered profile, wherein a width of an upper portion of the via metal is wider than a width of a lower portion of the via metal;
    a metal plug disposed on top of the via metal;
    a first barrier layer disposed along a sidewall of the via metal;
    an etch stop layer disposed over the substrate;
    an enclosure-air-gap all around the conductive feature and the via metal; and
    a dielectric layer over the enclosure-air-gap, wherein the dielectric layer has a first surface and a second surface that faces the first surface and intersects the first surface, and wherein the enclosure-air-gap extends between the first and second surfaces of the dielectric layer, wherein the enclosure-air-gap is defined by the dielectric layer, the etch stop layer, and the first barrier layer.

2. The IC of claim 1, wherein the metal plug and the via metal are formed of the same metal material.

3. The IC of claim 1, wherein the etch stop layer defines a bottom surface of the enclosure-air-gap and the dielectric layer defines a top surface of the enclosure-air-gap.

4. The IC of claim 1, wherein the substrate includes a dielectric material.

5. The IC of claim 1, further comprising a second barrier layer disposed along a sidewall of the conductive feature.

6. The IC of claim 5, wherein the first barrier layer interfaces with the second barrier layer.

7. A device comprising:
    a first conductive feature and a second conductive feature disposed over a semiconductor substrate;
    a via metal disposed directly on the first conductive feature, the via metal having a first portion having a first width and a second portion having a second width that is different than the first width;
    an etch stop layer extending along a sidewall of the first conductive feature;
    a first barrier layer disposed along a sidewall of the via metal;
    a metal plug disposed over the second conductive feature;
    a first dielectric layer extending between the metal plug and the via metal, wherein the first dielectric layer has a first surface and a second surface that faces the first surface and intersects the first surface; and
    an enclosure-air-gap all around the first conductive feature, wherein the enclosure-air-gap extends between the first and second surfaces of the first dielectric layer, wherein the enclosure-air-gap is defined by the first dielectric layer, the etch stop layer, and the first barrier layer.

8. The device of claim 7, wherein the first dielectric layer extends to the etch stop layer.

9. The device of claim 7, further comprising a second barrier layer disposed directly on the sidewall of the first conductive feature and a third barrier layer disposed directly on the sidewall of the second conductive feature, and
    wherein the etch stop layer extends from the first barrier layer to the second barrier layer.

10. The device of claim 9, further comprising a second dielectric layer disposed over the second conductive feature, and
    wherein the etch stop layer includes a first sidewall and a second opposing sidewall, and
    wherein the first dielectric layer physically contacts the first sidewall of the etch stop layer and the second dielectric layer physically contacts the second sidewall of the etch stop layer.

11. The device of claim 10, wherein the etch stop layer has a top surface extending from the first sidewall to the second sidewall, and
    wherein the first dielectric layer physically contacts the top surface of the etch stop layer.

12. The device of claim 7, wherein the enclosure-air-gap includes a first portion having a first width, a second portion having a second width, and a third portion having a third width, wherein the first, second, and third widths are different.

13. The device of claim 7, wherein the enclosure-air-gap extends from the etch stop layer disposed along the sidewall of the first conductive feature to the etch stop layer disposed along a sidewall of the second conductive feature.

14. The device of claim 7, further comprising a second barrier layer extending along a sidewall of the metal plug, and
    wherein the first dielectric layer extends from the first barrier layer to the second barrier layer.

15. A device comprising:
    a first conductive feature and a second conductive feature disposed over a semiconductor substrate;

a via metal disposed directly on the first conductive feature, the via metal having a first portion having a first width and a second portion having a second width that is different than the first width;

a first barrier layer extending along a sidewall of the via metal;

an etch stop layer extending along a sidewall of the first conductive feature;

a metal plug disposed over the second conductive feature;

a second barrier layer extending along a sidewall of the metal plug;

a first dielectric layer extending from the first barrier layer to the second barrier layer; and an enclosure-air-gap all around the first conductive feature, the enclosure-air-gap being defined by the first dielectric layer, the etch stop layer, and the first barrier layer.

16. The device of claim 15, wherein the first dielectric layer has a first surface and a second surface that faces the first surface and intersects the first surface, and wherein the enclosure-air-gap extends between the first and second surfaces of the first dielectric layer.

17. The device of claim 15, wherein the first dielectric layer has a surface facing a surface of the first barrier layer, and wherein the enclosure-air-gap extends from the surface of the first dielectric layer to the surface of the first barrier layer.

18. The device of claim 15, further comprising a third barrier layer disposed directly on the sidewall of the first conductive feature, and wherein the third barrier layer interfaces with the first barrier layer.

19. The device of claim 15, further comprising a second dielectric layer disposed over the semiconductor substrate, and wherein a bottom surface of the first conductive feature physically contacts the second dielectric layer.

20. The device of claim 15, wherein the etch stop layer extends along the sidewall of the first conductive feature without extending along the sidewall of the via metal.

* * * * *